US007187201B1

(12) United States Patent
Trimberger (10) Patent No.: US 7,187,201 B1
(45) Date of Patent: Mar. 6, 2007

(54) PROGRAMMABLE LOGIC DEVICE SUITABLE FOR IMPLEMENTATION IN MOLECULAR ELECTRONICS

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 174 days.

(21) Appl. No.: 10/877,906

(22) Filed: Jun. 24, 2004

(51) Int. Cl.
*H03K 19/177* (2006.01)

(52) U.S. Cl. .................... 326/41; 326/38; 977/932; 977/938; 977/940

(58) Field of Classification Search ............... 326/41, 326/47, 101
See application file for complete search history.

(56) References Cited

U.S. PATENT DOCUMENTS

| 6,107,038 | A | 8/2000 | Choudhary et al. |
| 6,128,214 | A | 10/2000 | Kuekes et al. |
| 6,215,327 | B1 | 4/2001 | Lyke |
| 6,256,767 | B1 | 7/2001 | Kuekes et al. |
| 6,314,019 | B1 | 11/2001 | Kuekes et al. |
| 6,432,740 | B1 | 8/2002 | Chen |
| 6,459,095 | B1 | 10/2002 | Heath et al. |
| 2003/0089899 | A1 | 5/2003 | Lieber et al. |
| 2003/0200521 | A1* | 10/2003 | DeHon et al. ............ 716/16 |
| 2005/0017234 | A1* | 1/2005 | DeHon et al. ............ 257/9 |

OTHER PUBLICATIONS

Golstein et al.; "Digital Logic Using Molecular Electronics"; Solid-State Circuits Conference, 2002; Digest of Technical Papers; ISSCC 2002 IEEE International; available from http://search.ieeexplore.ieee.org; Abstract [1 pg.]; pp. 204-459.
Srivastave et al.; "Computational Nanotechnology with Carbon Nanotu and Fullerenes"; Computing in Science and Engineering; Computing in Science and Engineering; available from http://search.ieeexplore.ieee.org; Abstract [1 pg.]; pp. 42-55, Jul./Aug. 2001.
Dekker; "Carbon Nanotubes as Molecular Quantum Wires"; 1999 American Institute of Physics; May 1999; Physics Today; pp. 22-28.
C. P. Collier et al.; "Electronically Configurable Molecular-Based Logic Gates"; www.sciencemag.org; Science; vol. 285; Jul. 16, 1999; pp. 391-394.
Alfredo M. Morales et al.; "A Laser Ablation Method for the Synthesis of Crystalline Semiconductor Nanowires"; Science, vol. 279; Jan. 9, 1998; www.sciencemag.org; pp. 208-211.
Andre DeHon et al.; "Nanowire-Based Sublithographic Programmable Logic Arrays"; FPGA '04; Feb. 22-24, 2004; Copyright 2004; pp. 123-132.
James R. Heath et al.; "Molecular Electronics"; 2003 American Institute of Physics; May 2004 Physics Today; pp. 43-49.

(Continued)

*Primary Examiner*—Vibol Tan
(74) *Attorney, Agent, or Firm*—Samuel R. Campbell, III; Michael Wallace (57) ABSTRACT

Pullup and pulldown structures can be formed using nanoscale programmable junctions. These devices can be integrated into nanoscale circuit designs and can be programmably configured, e.g., desired resistance values set. Additionally, the pullup and pulldown devices allow for convenient integration of nanoscale devices with microscale devices.

53 Claims, 5 Drawing Sheets

OTHER PUBLICATIONS

Thomas Rueckes et al.; "Carbon Nanotube-Based Nonvolatile Random Access Memory for Molecular Computing"; Jul. 7, 2000; vol. 289 Science; available from www.sciencemag.org.; pp. 94-97.

Andre DeHon; "Array-Based Architecture for Molecular Electronics"; First Workshop on Non-Silicon Computation; Feb. 3, 2002; pp. 1-8.

Michael Butts et al.; "Molecular Electronics: Devices, Systems and Tools for Gigagate, Gigabit Chips"; 2002 IEEE; pp. 1-8.

M. A. Reed et al.; "The Design and Measurement of Molecular Electronic Switches and Memories"; ISSGG 2001, Session 7, Technology Directions Advanced Technologies, 7.2; 2001 IEEE International Solid-State Circuits Conference; pp. 1-3.

Rowan Dordick; "Moving Molecules at Room Temperature"; available from http://domino.research.ibm.com; downloaded Jan. 9, 2003; pp. 1-3.

HP Press Release; "HP Receives Another Key Molecular Electronics Patent"; Nov. 12, 2002; available from http://www.hpl.hp.com; downloaded Jan. 9, 2003; pp. 1-2.

HP Press Release; "HP Announces Breakthroughs in Molecular Electronics"; Sep. 9, 2002; available from http://www.hp.com; downloaded Jan. 9, 2003; pp. 1-2.

HP Press Release; "HP, UCLA Collaboration Receives Key Molecular Electronics Patent"; Jan. 23, 2002; available from http://www.hp.com; downloaded Jan. 9, 2003; pp. 1-3.

Molecular Information Storage; "Molecular Information Storage"; available from http://www.ncsu.edu; downloaded Jan. 9, 2003; pp. 1-4.

Molecular Switch for Future Storage; "Molecular Switch for Future Storage"; Oct. 3, 2001; available from http://www.stp-gateway.de; downloaded Jan. 09, 2003; pp. 1.

Evan Hansen; "Experiment Points to new Spin on Storage"; Dec. 2, 2002; available from http://news.com; diwbkiaded Jan. 9, 2003; pp. 1-2.

Advance Material Research Institute; "Molecular Modeling—Molecules for Information Storage"; available from http://amri.unn.ac.uk/molecular_storage.asp; downloaded Jan. 9, 2003; pp. 1-3.

PhysicsWeb; "Molecular Storage Ring Makes its Debut"; Jul. 2001; Physics World; available from http://physicsweb.org; downloaded Jan. 9, 2003; pp. 1.

Eric Lerner; "Big Step Toward Molecular Electronics"; Dec. 12, 2002; http://www.aip.org; The Industrial Physicist; pp. 1-2.

Colossal Storage Corp.; "3D Volume Holographic Optical Data Storage NanoTechnology"; available from wysiwyg://mainFrame.182/http://www.colossalstorage.net; downloaded Feb. 10, 2003; pp. 1-8.

Evan Hansen; "Experiment Points to New Spin on Storage"; Dec. 2, 2002; available from http://news.com; downloaded Feb. 10, 2003; pp. 1-2.

R&D Magazine; "Improving Current Measurements on Nanoelectronic and Molecular Electronic Devices"; R&D Magazine; Mar. 2003; www.rdmag.com; pp. 35-38.

* cited by examiner

PROGRAMMABLE LOGIC DEVICE SUITABLE FOR IMPLEMENTATION IN MOLECULAR ELECTRONICS

TECHNICAL FIELD

The present invention relates to molecular electronic devices and particularly programmable molecular electronic devices.

BACKGROUND

In the past several decades, silicon-based microelectronics have dominated the electronics industry, and provided the industry nearly constant exponential growth in device capability. However, it is unlikely that silicon-based microelectronic technology can maintain past advancement rates for more than a decade or two longer. Fundamental physical limitations, which prevent current designs from functioning reliably at the nanometer scale will likely be reached, and rapidly rising fabrication costs will make it prohibitive to increase integration levels.

New solutions are being developed to transform electronic devices to ever smaller dimensions, and in particular to circuits constructed using nanometer-scale devices. Molecular electronics can in principle overcome many of the limitations of silicon technology because it is possible to have single-molecule devices that are organized cheaply in parallel by self-assembly. Much of the current development focuses on two key areas of device design: the "wires" or primary conductive or semiconductive paths to be used in the nanometer-scale devices, and the techniques for forming interconnections between such wires.

Two promising nanometer-scale wire technologies are conducting or semiconducting (e.g., silicon) nanowires, and carbon nanotubes. Note that throughout this application, the terms "wire" and "wires" will be used to generally refer to both nanotubes and nanowires.

A number of technologies are being developed to grow nanowire structures, and particularly silicon nanowires which are typically on the order of nanometers in width and can be grown or assembled into sets of long parallel nanowires. The electrical properties of such wires can generally be controlled by selection of the underlying material, and/or by the selection of dopants. Various different nanowire structures and fabrication techniques are well known in the art, and examples can be found in Kueckes et al., U.S. Pat. No. 6,128,214; Morales et al., "A Laser Ablation Method for Synthesis of Crystalline Semiconductor Nanowires," *Science,* 279:208–211, 1998; and Collier et al., "Electronically Configurable Molecular-Based Logic Gates," *Science,* 285: 391–394, 1999; each of which is hereby incorporated herein by reference, in its entirety.

Carbon nanotubes are cylindrical molecules with a diameter of as little as one nanometer and a length typically up to many microns. They comprise carbon atoms and, in the single-walled configuration, can be thought of as a monolayer of graphite wrapped into cylindrical form. Carbon nanotubes can exhibit unique electronic, mechanical, and chemical properties that make them attractive building blocks for molecular electronics. Depending on diameter and helicity, these nanotubes behave as one-dimensional metals or as semiconductors which, by virtue of their great mechanical toughness and chemical inertness, represent good materials for creating reliable, high-density input/ output (I/O) wire arrays. Carbon nanotubes have even been used to make specialized field effect transistors. Additionally, the growth and alignment of these nanotubes can be controlled such that they can be assembled into parallel (or roughly parallel) rows of conductors and layered into arrays. Moreover, nanowires can be, in principle, assembled along with nanotubes when their respective properties complement each other. Carbide nanotubes, i.e., nanotubes made from carbon and one or more other elements, doped carbon nanotubes, and nanotubes formed from other materials can also be implemented. Various different nanotube structures and fabrication techniques are well known in the art, and examples can be found in Lieber et al., U.S. Patent Application No. 20030089899; Rueckes et al., "Carbon nanotube-Based Nonvolatile Random Access Memory for Molecular Computing," *Science,* 289:94–97, 2000; and Dekker, "Carbon Nanotubes as Molecular Quantum Wires," *Physics Today,* 52 no. 5, 22–28, 1999; each of which is hereby incorporated herein by reference, in its entirety.

Many different schemes for constructing nanometer-scale devices using nanotubes and/or nanowires have been disclosed. Most of those techniques use some mechanism to establish an electronic connection or junction between separate wires, typically oriented at some non-zero angle with respect to each other. The most promising mechanisms are repeatable and at least bi-stable, allowing for at least two programmable states, e.g., an ON state and an OFF state. In this manner, programmable nanometer-scale interconnects can be formed and arrays of such interconnects can be used to construct circuit devices.

Figure 1A:
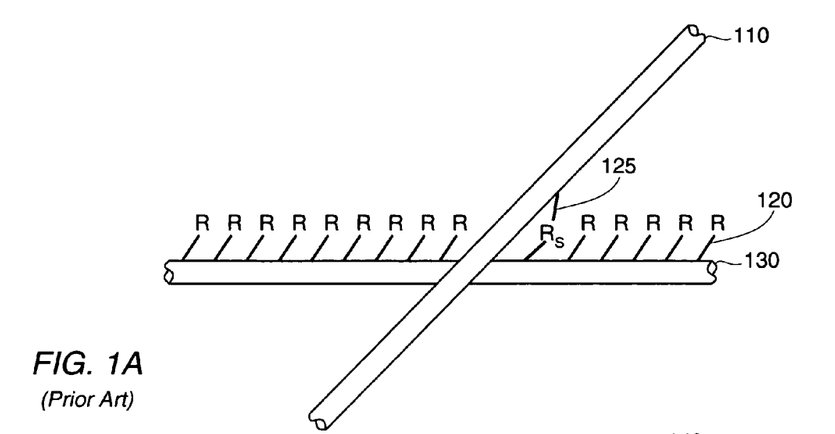
FIGS. 1A–1D illustrate simplified diagrams of several different types of prior art nanometer-scale interconnect technologies.
Figure 1B:
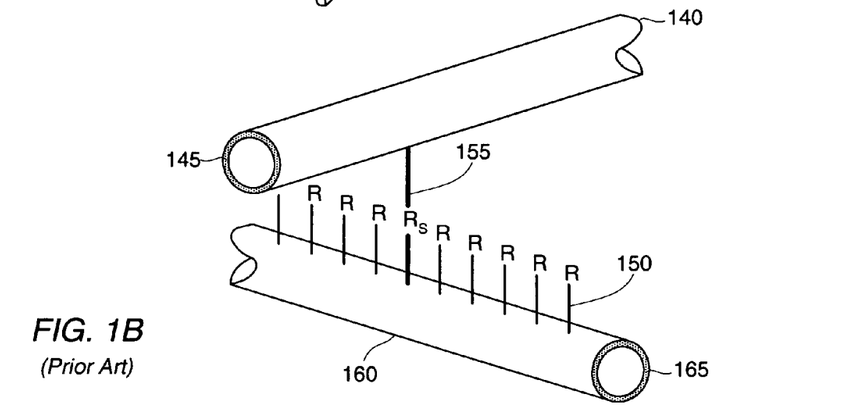

FIGS. 1A and 1B illustrate prior art examples of such interconnects where the interconnect mechanism is formed from one or more molecules. FIGS. 1A and 1B each illustrate a crossed wire switch formed from two wires (110 and 130, 140 and 160). Wires 110, 130, 140, and 160 are typically metal or semiconductor nanowires, although in some implementations they can be nanotubes, crossed at some non-zero angle. In between those wires is a layer of molecules or molecular compounds (120 and 150). The particular molecules (125 and 155) that are coupled between two wires to form a junction are identified as switch molecules ($R_S$). For example, when an appropriate voltage is applied across the wires, the switch molecules can be either oxidized or reduced. When a molecule is oxidized (reduced), then a second species is reduced (oxidized) so that charge is balanced. These two species are then called a redox pair. Such redox pairs can be formed using two or more molecules, or using a molecule and one or both of the wires. In general, oxidation or reduction will affect the tunneling distance or the tunneling barrier height between the two wires, thereby altering the rate of charge transport across the wire junction, and serving as the basis for a switch.

While FIG. 1A depicts the use of conventional nanometer-scale wires, FIG. 1B shows wires that include coatings or doped regions 145 and 165. Examples of layers 145 and 165 include modulation-doping coatings, tunneling barriers (e.g., oxides), or other nanoscale functionally suitable materials. Alternatively, the wires themselves may be coated with one or more molecular species such as molecules 150 or some other molecular species.

Thus, electronic devices can formed with sizes from on the order of tens of nanometers to one nanometer simply by making contact between two nanometer-scale wires. Careful selection of the molecules R and/or the outer layers 145 and 165 allows devices with a wide variety of electrical properties.

Figure 1C:
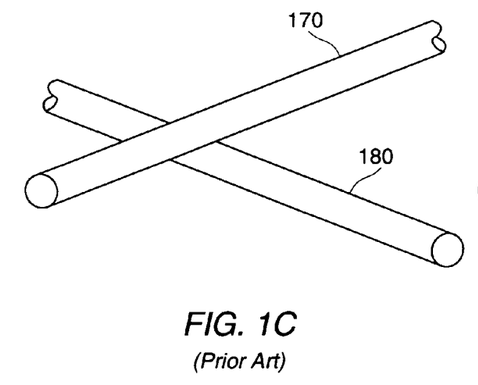
Figure 1D:
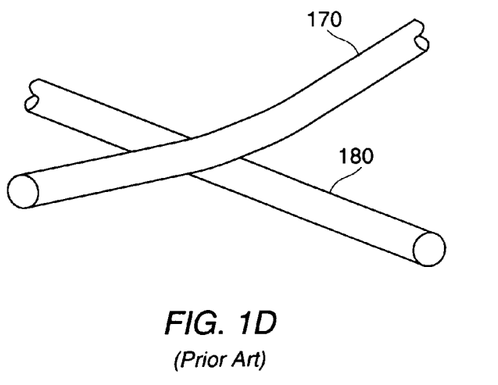

Examples of interconnects formed through contact (or near contact) of portions of the wires are shown in prior art FIGS. 1C and 1D. As shown in FIG. 1C, nanowires or nanotubes 170 and 180 are also typically arranged so that they cross at some non-zero angle and have a definite separation at the crosspoint. In these structures, at least one of 170 and 180 (usually the "suspended" one, i.e., 170) is typically a nanotube. This scheme can be used to form a suspended array of bi-stable device elements with well-defined OFF and ON states. This array includes a first set of parallel (or roughly parallel) nanotubes or nanowires on a substrate and another set of such wires oriented at a non-zero angle with respect to the first set and suspended on a periodic array of supports. Each crosspoint corresponds to a programmable junction where bi-stability can be envisioned as arising from the interplay of the elastic energy (which produces a potential energy minimum at finite separation) and the attractive van der Waals energy (which creates a second energy minimum when the suspended nanotube/nanowire is deflected into contact or close proximity with the lower wire).

These two minima correspond to well-defined OFF and ON states, respectively. FIG. 1C illustrates the OFF state, i.e., the separated upper-to-lower junction resistance will be very high. FIG. 1D illustrates the ON state where wire 170 has been deflected to make contact with wire 180 (or to be close enough so that the tunneling distance corresponds to a stable energy state). The associated junction resistance in this state will be orders of magnitude lower, providing a well defined ON state.

FIGS. 1A–1D illustrate a number of different nanometer-scale interconnect technologies. In general, all of these technologies, and other technologies not illustrated have the advantage that they are programmable, either once or repeatedly over the lifetime of the device. Many have proposed that cross-wire interconnect arrays based on these nanometer-scale wire technologies and interconnect technologies will be the basis for molecular electronic devices. Moreover, although researchers are optimistic about the ultimate defect rates of such devices, even conservative estimates indicate the need for a high degree of programmability in molecular electronic devices so as to avoid defective portions of the device and make use of redundant circuit elements.

Consequently, many molecular electronic devices will, in some fundamental sense, be analogous to current programmable logic devices. Logic devices, memory devices, and interconnect devices will interoperate to allow circuit designers to achieve the desired architecture or functionality. One important problem that has yet to be adequately addressed by molecular electronics designers and researchers is the design and implementation of devices, e.g., restoring logic, for ensuring that logic signals do not become degraded and/or that those logic signals that do become degraded in some way can be properly restored.

Accordingly, it is desirable to have molecular electronic devices and techniques that address this deficiency in the prior art, yet are relatively easy to design, model, and implement.

SUMMARY

It has been discovered that pullup and pulldown structures can be formed using nanoscale programmable junctions. These devices can be integrated into nanoscale circuit designs and can be programmably configured, e.g., desired resistance values set. Additionally, the pullup and pulldown devices allow for convenient integration of nanoscale devices with microscale devices.

Accordingly, one aspect of the present invention provides a circuit comprising a programmable cross-wire interconnect, a logic device, and at least one of a pullup device and a pulldown device coupled to the logic device. The programmable cross-wire interconnect includes a first plurality of wires and a second plurality of wires oriented with respect to the first plurality of wires so that a first one of the first plurality of wires crosses a first one of the second plurality of wires at a non-zero angle to form a programmable junction. The programmable junction includes a first molecule coupled between the first one of the first plurality of wires and the first one of the second plurality of wires. The first molecule has a first energy state and a second energy state. The logic device includes an input terminal and an output terminal. At least one of the input terminal and the output terminal is coupled to the first one of the first plurality of wires. The at least one of a pullup device and a pulldown device includes a second programmable junction formed between the first one of the first plurality of wires and a third wire. The second programmable junction includes a second molecule coupled between the first one of the first plurality of wires and the third. The second molecule has a first energy state and a second energy state.

Another aspect of the present invention provides a circuit including a logic device and a programmable cross-wire interconnect. The logic device includes an input terminal and an output terminal. The at least one of the input terminal and the output terminal is coupled to the programmable cross-wire interconnect. The programmable cross-wire interconnect includes a first plurality of nanometer-scale wires and a second plurality of nanometer-scale wires oriented with respect to the first plurality of nanometer-scale wires so that ones of the first plurality of nanometer-scale wires cross ones of the second plurality of nanometer-scale wires at non-zero angles to form a plurality programmable junctions. At least a first one of the plurality of programmable junctions forms one of a pullup device and a pulldown device.

Another aspect of the present invention provides a method. A first signal is applied to at least one of a first nanometer-scale wire and a second nanometer-scale wire to establish an electrical connection between the first nanometer-scale wire and the second nanometer-scale wire. The electrical connection between the first nanometer-scale wire and the second nanometer-scale wire has a first resistance. A second signal is applied to at least one of the second nanometer-scale wire and a third nanometer-scale wire to establish an electrical connection between the second nanometer-scale wire and the third nanometer-scale wire. The electrical connection between the second nanometer-scale wire and the third nanometer-scale wire has a second resistance. One of an input signal and an output signal is coupled through the electrical connection between the first-nanometer scale wire and the second-nanometer scale wire to a logic device. One of a pullup voltage and a pulldown voltage is coupled to the logic device through the electrical connection between the first-nanometer scale wire and the second-nanometer scale wire, and through the electrical connection between the second nanometer-scale wire and the third nanometer-scale wire.

The foregoing is a summary and thus contains, by necessity, simplifications, generalizations and omissions of detail; consequently, those skilled in the art will appreciate that the summary is illustrative only and is not intended to be in any way limiting. As will also be apparent to one skilled in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

A more complete understanding of the present invention and advantages thereof may be acquired by referring to the following description and the accompanying drawings, in which like reference numbers indicate like features.

DETAILED DESCRIPTION

The following sets forth a detailed description of at least the best contemplated mode for carrying out the one or more devices and/or processes described herein. The description is intended to be illustrative and should not be taken to be limiting.

As noted above, a variety of different technologies can be used to implement programmable junctions or interconnects in molecular electronic devices. Since one or more of theses technologies are likely to be used as the mechanism or mechanisms to program functionality into a device (e.g., analogous to programmable logic devices (PLDs), field programmable gate arrays (FPGAs), and the like) and to handle the re-routing of circuit pathways away from device defects, the programmable junctions are a convenient mechanism by which to implement restoring logic.

To that end, some information about the electronic properties of the junction, e.g., the available programmable resistance values of the junction devices, should be known or determinable. In some cases, actual resistance values may be known, while in other cases only relative values might be known. Moreover, the accuracy with which these values are known may very greatly from technology to technology, or even from device to device. In general, the absolute values need not be known. However, it will generally be desirable to have some information (e.g., order of magnitude information) about the various resistance values available. In still other implementations, it may not be necessary to have any information about the resistance values of different programmable states so long as those values are approximately the same from junction to junction across the device. Thus, for example, it may not be necessary to know the junction resistance in the ON and OFF states. It may be sufficient to simply know that all ON resistance values are approximately the same as each other, and that all OFF resistance values are approximately the same as each other.

Throughout this application, emphasis will be placed on programmable junctions that have two stable states (ON and OFF states). However, certain implementations can make use of junctions that have three or more stable states, as well as junctions that can have arbitrary resistance values depending on programming parameters. In general, the junction technology will dictate both the nature of the available programmable states as well as the method or methods that are used to program the junctions. Additionally, the programming step or steps can be part of the fabrication process so that, in some cases, finished molecular circuits based on these structures are no longer field programmable. Thus, these junctions are configurable or programmable in the broadest sense of the term.

For example, the devices illustrated in FIGS. 1A and 1B are, in the simplest sense, quantum state switches comprising an adjustable tunnel junction (molecule 125 or molecule 155) between two nanometer-scale wires. The wires are provided with a molecular species at the junctions that, for example, are bi-stable. The molecule species is addressed by setting voltages across the appropriate two wires. The chemical species that form the molecular link between the wires can be electrochemically oxidized or reduced. Some types of molecules can be cycled reversibly and others will react irreversibly. The chemical state of the molecular switches determines the tunneling resistance between the two wires, which is generally exponentially dependent on both width and barrier height of the tunneling gap.

In some implementations, the bi-stable molecules (e.g., molecules 120 and 150) comprise a rotaxane molecule. Rotaxanes contain two or more molecular components mechanically interlocked with one another. One component is typically a dumbbell-shaped or backbone component having one or more binding sites. The remaining component(s) are circular or ring-shaped component(s) that become trapped on the dumbbell component, encircling part of that component. A particular ring makes mechanical contact with, but is typically not chemically bonded to, the backbone. Depending on how the ring component is fabricated, the component may have one or more preferred minimum-energy locations along the backbone. Other examples of molecules that can be used include pseudo-rotaxanes and catenanes. Catenanes and rotaxanes are both examples of interlocked molecules. Unlike classical molecular structures, they comprise two or more separate components which are not connected by chemical (i.e. covalent) bonds. These structures are, however, true molecules as each component is intrinsically linked to the other—resulting in a mechanical bond which prevents dissociation without cleavage of one or more covalent bonds.

As previously noted, programming these types of junctions typically involves applying a voltage between the two wires forming part of the junction. Programming devices such as those illustrated in FIGS. 1C–1D can involve applying a voltage between the two corresponding wires. In other examples, a junction can be switched between well-defined OFF and ON states by transiently charging the nanotubes to produce attractive or repulsive electrostatic forces. Similarly, the ON/OFF state of a junction can be switched between OFF and ON states by applying voltage pulses. Other molecules can be used for the junction with other physical effects providing the on and off states.

In other embodiments, the interconnect junctions can be designed to exhibit diode behavior. For example, by using the devices described above or by using two different types of wires, e.g., one set of wires doped to form p-type semiconductors and the other set of wires doped to form n-type semiconductors, diodes can be constructed at the junctions. In still other embodiments, the individual connection molecular species can be selected to act as an asymmetric non-linear resistor or a very high resistance connection between the wire pairs. As an asymmetric non-linear resistor, the junction would, for example, have relatively low resistance when it is forward biased and much higher resistance when it is reverse biased.

Figure 2:
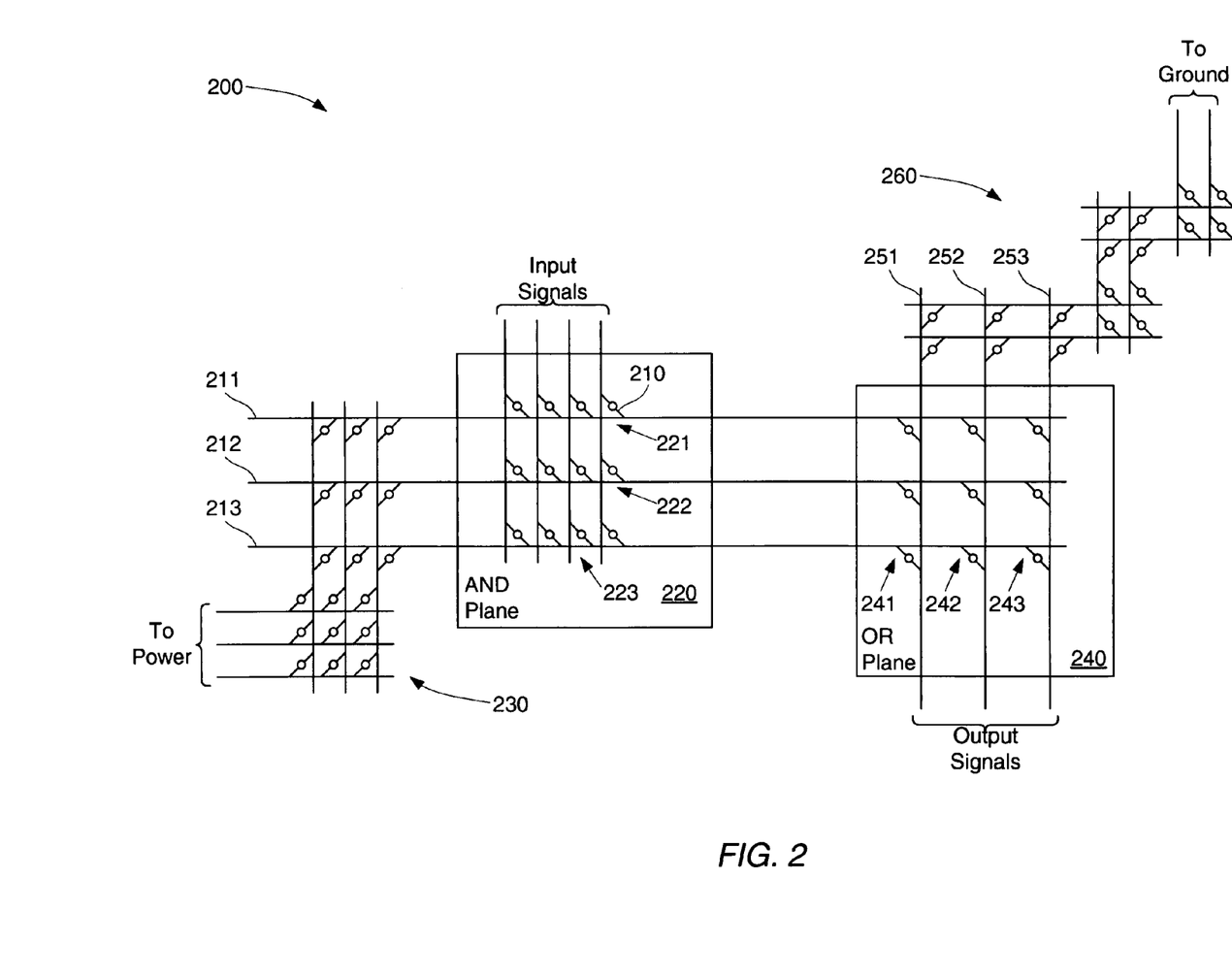
FIG. 2 illustrates a simplified schematic diagram of one implementation of the present invention.

FIG. 2 illustrates a partial schematic diagram of a molecular electronic device 200. Molecular electronic device 200 can be constructed from nanometer-scale and molecular electronic components, or a combination of such components and traditional microelectronics such as silicon-based integrated circuit devices. For example, various logic devices illustrated, i.e., AND gates 221–223 and OR gates 241–243 can be implemented using various different technologies.

The foundation of molecular electronic device 200 is a cross-wire interconnect formed from nanometer scale wires and having programmable junctions formed at the intersection points of various wires. Depending on the overall architecture of molecular electronic device 200 the cross-wire interconnect can be uniform throughout the device, or have local areas of cross-wire interconnect. The wires eventually lead out of molecular electronic device 200 so that they can be coupled with other devices, terminals associated with device packaging, power sources, ground, and the like. As shown, some wires are specifically presented for coupling signals into or out of the molecular electronic device. Still other wires are used in whole or in part to support logic state maintaining devices such as pullup network 230 and pulldown network 260.

Each programmable junction is illustrated schematically as junction 210. Although shown as a diagonal connection, these programmable junctions are generally made at the crossings of wires. The programming junction is typically a vertical structure between a plane of horizontal (e.g., product term) lines and vertical (e.g., input) lines. Note that when shown with a white center (not filled in) a programmable junction can be considered as set in its OFF state. Still other aspects of FIG. 2 are simplified. For example, only portions of the cross-wire interconnect are shown. Wires will typically extend to various contact pads and terminals. Additionally, many more wires might be present in the interconnect as a whole, or in certain portions such as pullup network 230 and pulldown network 260.

Molecular electronic device 200 is organized as an AND/OR programmable logic arrays (PLA). A PLA was chosen to illustrate the implementation of pullup and pulldown devices for a variety of reasons. PLAs are simple, well understood programmable logic devices that have been successfully applied to the design of control logic and simple functions such as counters, small adders, etc. The AND-OR structures of PLAs can implement complex functions of their inputs in only two levels of logic. Larger adders can be implemented on using PLAs in an iterative fashion, e.g., a few bits per cycle. PLAs can also be scaled to arbitrary sizes. Again, the use of PLA architectures generally, and AND/OR devices specifically, in molecular electronic device 200 is merely illustrative of the many different types of logic devices and architectures that can utilize the devices and techniques of the present invention. Thus, for example, a molecular electronic device such as device 200 can be implemented using different types of logic devices, e.g., AND, NAND, OR, NOR, XOR, and XNOR gates. Similarly, more complex structures formed from logic and/or memory devices such as adders, latches, registers, etc. can also be implemented. Moreover, more complex programmable logic device architectures, such as FPGA architectures, can make use of the present devices and techniques. Those having ordinary skill in the art will readily recognize the various types of devices that can comprise molecular electronic device 200.

Molecular electronic device 200 includes AND plane 220 and OR plane 240 arranged in series. Again, for simplicity, certain typical elements of device 200 such as input buffers, inverted (complement) signal lines, etc., have not been illustrated. The plane names, AND-OR, describe the generic logic levels of the familiar SEARCH-READ arrays of an associative table. The generic AND (SEARCH) plane produces an array of product terms of the inputs signals. Each product term is the AND of functions of the individual inputs as determined by the programming of various junctions. The generic OR (READ) plane produces an OR of selected product terms on each array output. As with AND plane 220, OR plane 240 is programmed using various programmable junctions at each intersection of a product term with an input line.

The logic devices used in molecular electronic device 200 can be fabricated using well known microelectronics techniques or using newer molecular electronics techniques. For example, linear arrays of the same programmable junctions described above can be configured into AND and OR wired-logic gates. In particular, such structures can be used to form truth tables that provide the desired logic function. The truth table of any AND gate is such that a high response is only recorded when all inputs are high. Although such gates are formed from a network of dissipative devices, they can still have good response. Moreover, the highly nonlinear I-V characteristics of many resonant-tunneling junctions can yield very high (e.g., 15 to 1) differences in current flow between high and low states. This feature can be useful for allowing combinations of wired-AND and wired-OR gates with each other to create complex logic circuits. Further discussion of such devices can be found, for example, in the aforementioned Collier et al. reference.

Thus, for example, AND gate 221 is formed from the product term by programming multiple inputs (using programmable junctions) to connect to the same horizontal product term line (211). When AND-plane 220 is programmed, one selects whether or not each input is connected to a product term. AND gates 222 and 223 operate in a similar manner. Such logic devices can be implemented using any of the programmable interconnect technologies described above. In one embodiment, diode devices are used. A non-programmed junction is unconnected, while a programmed junction becomes a diode that permits current to flow from the horizontal to the vertical line, so any input that is connected to the product term line causes the line to go to low (through the $R_{ON}$ of the diode). Diode implementation helps to prevent the shorting of inputs to each other and product terms to each other when two inputs, for example, are connected to the same product term. OR gates 241–243 are constructed in a similar manner. For example, any or all of the three product term lines can be connected to OR gate input 251 to form OR gate 241.

Pullup network 230 is implemented to provide the desired pullup resistance to each of the inputs of AND gates 221–223 so that given no other input signal on those inputs, the gates maintain a default value. By including a pullup, one can achieve a wired-AND function on one line. Pullup network 230 is constructed from one or more programmable junctions for each input of the logic devices. In cases where redundancy is required, e.g., for defect tolerance, or where a single programmable junction may not be able to provide the requisite pullup resistance, multiple junctions in series can be used. As shown in pullup network 230, two programmable junctions are used in series on each product term to achieve the desired pullup resistance value. This will be further illustrated in FIG. 3 as described below. Although only two junctions per gate input are shown, device 200 can be designed to include as many as desired or necessary. However, where programmable junction resistance values are relatively uniform throughout the device, having two junctions programmed to be in the ON state can be adequate, as will be seen in the discussion accompanying FIG. 4A.

Pulldown network 260 is implemented in a similar manner to provide the desired pulldown resistance to each of the inputs of OR gates 251–253 so that given no other input signal on those inputs, the gates maintain the proper default value. Pulldown network 260 is constructed from one or more programmable junctions for each input of the logic devices. In cases where a single programmable junction is not adequate, multiple junctions in series can be used. As shown in pulldown network 260, four programmable junctions in series are used for each gate input to achieve the desired pulldown resistance value. This will be further illustrated in FIG. 3 as described below. In general, device 200 can be designed to include as many junctions for use as pulldown resistors as desired or necessary. However, where programmable junction resistance values are relatively uniform throughout the device, having four junctions programmed to be in the ON state can be adequate, as will be seen in the discussion accompanying FIG. 4B. Where available, non-programmable resistive junctions can be used.

Figure 3:
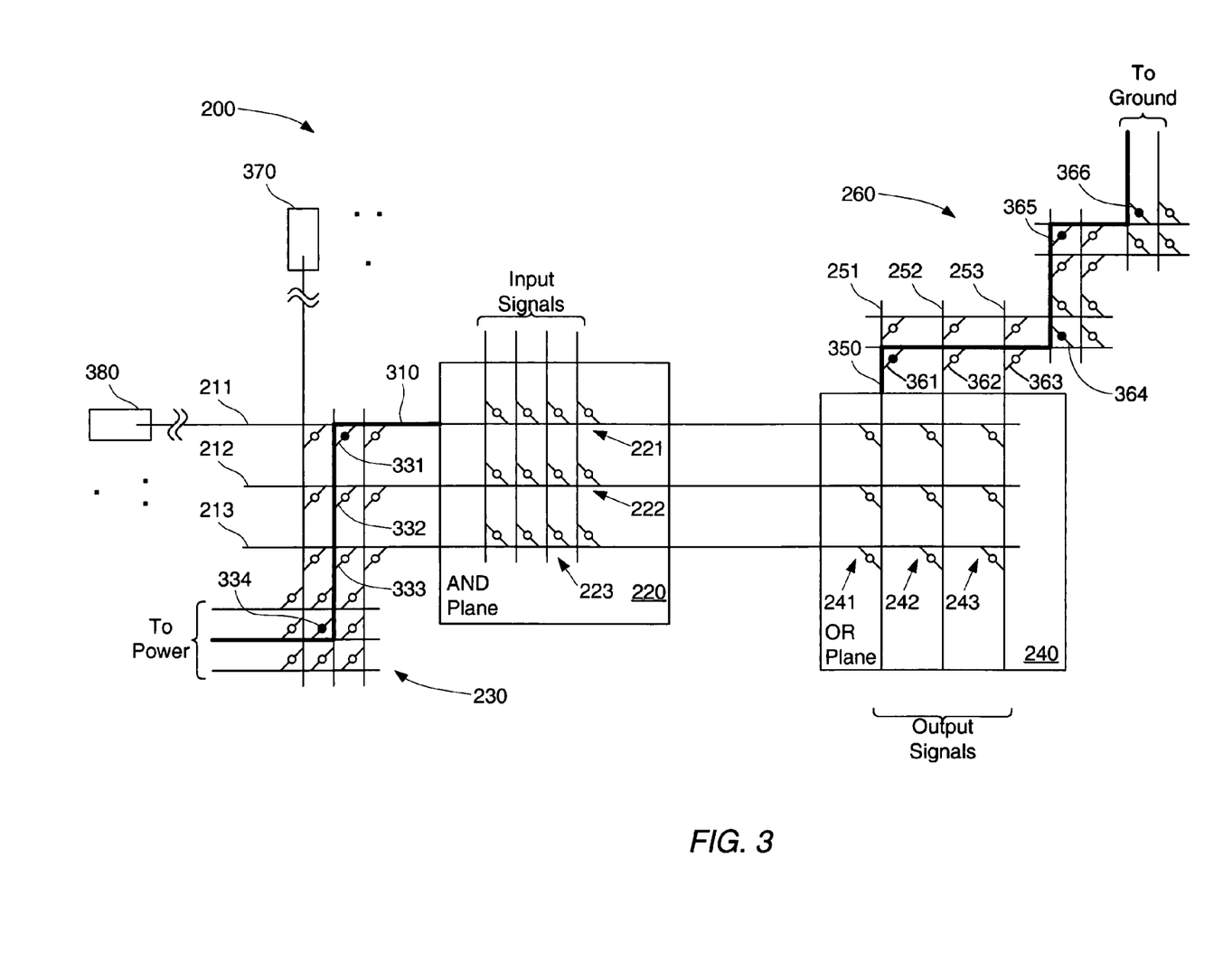
FIG. 3 further illustrates a simplified schematic diagram of one implementation of the present invention.

One advantage of this layout is that it permits every horizontal and vertical wire to reach the outside of the array. Thus, every wire has the capability to be brought out to a microelectronic circuit, wire, or contact pad that enables programming. For Example, FIG. 3 illustrates microscale wires 370 and 380. Wires 370 and 380 are typically formed using traditional microelectronics processes. Note that the providing "large-scale" microelectronic wires along the top and left as shown can allow additional nanoscale logic to be arrayed below and to the right while extending the microscale connections. No nanoscale alignment is required, and all signals, including pullup and pulldown connections are accessible externally for programming.

As illustrated in FIGS. 2 and 3, junctions 210 are not shown as having an explicit directionality. In the case where the junctions operate as diodes, it may be desirable to implement the junctions in an explicitly directional manner. For example, junctions can be implemented as diodes in the AND and OR planes to permit current flow from horizontal to vertical lines. Programmable junctions in the pullup and pulldown structures can be constructed in a similar manner. Such an implementation can simplify device construction since all horizontal lines and vertical lines (and the molecular material in between) are the same.

FIG. 3 illustrates several examples of complete, programmed pullup and pulldown paths implemented within molecular electronic device 200. Pullup path 310 extends from wire 211 through programmable junctions 331 and 334 to a power source, e.g., $V_{CC}$. As illustrated in FIG. 3, a programmed junction, e.g., programmed to be in the ON state, is represented by a junction symbol having a solid black center (filled in). Thus, between each input of AND gate 221 and a power or specified voltage source are two junctions programmed to the ON state. For each such path, this effectively provides a pullup resistance of $2R_{ON}$, where $R_{ON}$ is the resistance of a junction in the ON state. In a typical implementation, junctions 332 and 333 might also be programmed to the ON state so as to provide pullup resistance to the terminals of AND gates 222 and 223. Alternatively, junctions 332 and 333 can be programmed to alternate pullup paths either to achieve a lower resistance or to avoid defects.

Similarly, pulldown path 350 extends from wire 251 through programmable junctions 361, 364, 365, and 366 to a ground. Between each input of OR gate 241 and ground are four junctions programmed to the ON state. For each such path, this effectively provides a pulldown resistance of $4R_{ON}$. In a typical implementation, junctions 362 and 363 might also be programmed to the ON state so as to provide pulldown resistance to the terminals of OR gates 242 and 243.

Figure 4A:
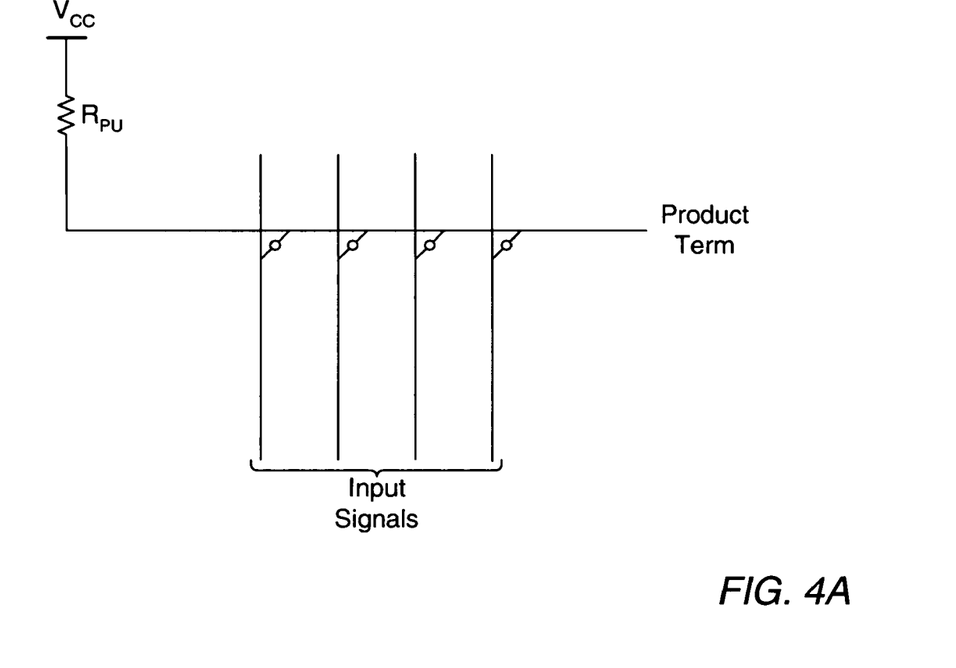
FIGS. 4A–4B illustrate example device implementations for the purpose of determining certain implementation parameters.

Determining the proper amount of pullup or pulldown resistance for a particular device can depend on a number of factors including: the type of cross-wire interconnect formed from nanometer scale wires, the available programmable resistance values or stable states, the degree to which such values are uniform across the device, etc. FIG. 4A illustrates a sample circuit layout for use in determining the approximate "safe" values for pullup resistance. In this case, it will be assumed that the resistance value of a junction in the ON state ($R_{ON}$) and the OFF state ($R_{OFF}$) are roughly constant throughout the device. The wires and junctions forming an AND gate, e.g., a gate such as gate 221, are shown. The pullup resistance is represented here as resistor $R_{PU}$, although in implementation $R_{PU}$ will be provided by one or more programmed junctions.

Estimating the resistances associated with various points in the circuit provides useful information about the limits that can be imposed on $R_{PU}$ and $R_{PD}$ (the pulldown resistance). A range of values for each resistance can be obtained by inspection. For the circuit of FIG. 4A to operate as an AND gate, $R_{PU}$ should pull the product term signal high if none of the programmable junctions is programmed to be ON. Therefore, $R_{PU}$ should be less than four times $R_{OFF}$ and for an arbitrary number of inputs, I, $R_{PU} < I*R_{OFF}$. Additionally, if any one input signal is a logic zero, the output of the AND gate should be logic zero, and thus $R_{PU}$ should be greater than $R_{ON}$.

Figure 4B:
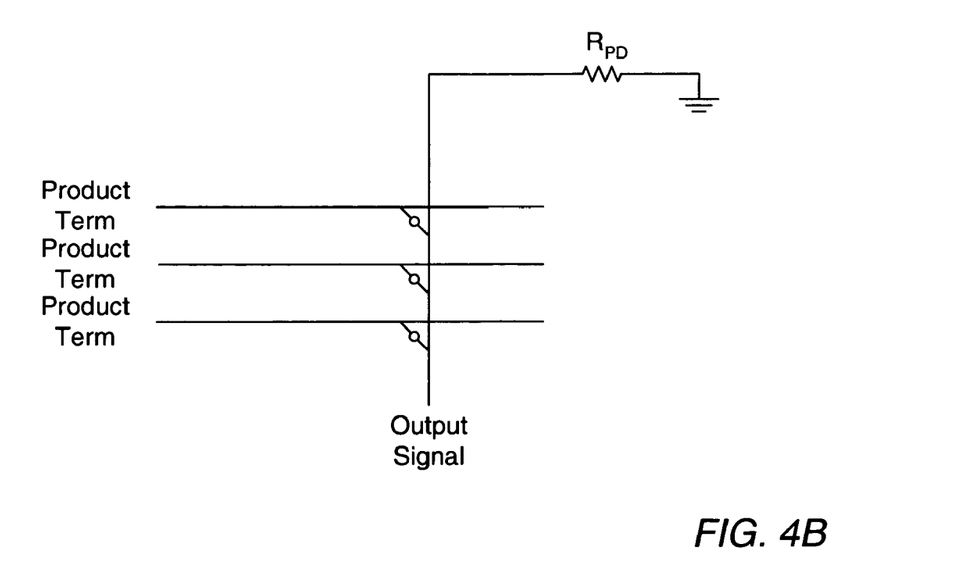

For the circuit of FIG. 4B to operate as an OR gate, $R_{PD}$ should pull the output signal low if none of the programmable junctions is programmed ON. In this case, one can consider the resistance of a product term line to $V_{CC}$ as $R_{PT+}$. Therefore, $R_{PD}$ should be less than three times the sum of $R_{OFF}$ and $R_{PT+}$. For an arbitrary number of product terms, P, $R_{PU} < P*(R_{OFF}+R_{PT+})$. Also, if any one product term signal is a logic one, the output of the OR gate should be logic one, and thus $R_{PD} > (R_{ON}+R_{PT+})$. The maximum value of $R_{PT+}$ occurs when the product term is being pulled up through $R_{PU}$. Therefore, $R_{PD} > (R_{ON}+R_{ON})$, i.e., $R_{PD} > 2*R_{ON}$.

If one assumes that $R_{ON}$ is negligibly small, $R_{PU}$ is independent of the number of number of inputs and $R_{PD}$ is independent of the number of product terms. In the analysis above, the input resistance was assumed to be negligibly small. If this is not the case, the limits on $R_{PU}$ and $R_{PD}$ may need to be adjusted to accommodate the different resistance values. The exact desired value of $R_{ON}$ and $R_{OFF}$ can also depend on the desired power consumption, as well as rise and fall times. In general, a lower resistance provides higher performance and higher power consumption. A higher resistance reduces power consumption, but lowers performance. The structure of FIG. 3 can be replicated to form resistances in a variety of sizes. Multiples of $R_{ON}$ can be formed by programmable points in series. Fractions of $R_{ON}$ can be formed by connecting programmable points in parallel. The selection of the resistance value for each product term or output can be chosen during programming to allow for variations in $R_{ON}$ from one product term to the next or to allow for different performance and power settings for different logic functions.

These estimates are merely examples of the guidelines one might use in selecting the number of programmable junctions to include in pullup and/or pulldown networks. As previously noted, for junctions that can be programmed to have arbitrary resistances or resistances different from the ON resistance associated with junctions coupling logic devices to signal terminals, fewer or more junctions may be desirable. Further, a diode can be added to each product term between the AND plane and the OR plane, thereby increasing $R_{PT}$ and possibly requiring adjustment of $R_{PD}$.

Figure 5A:
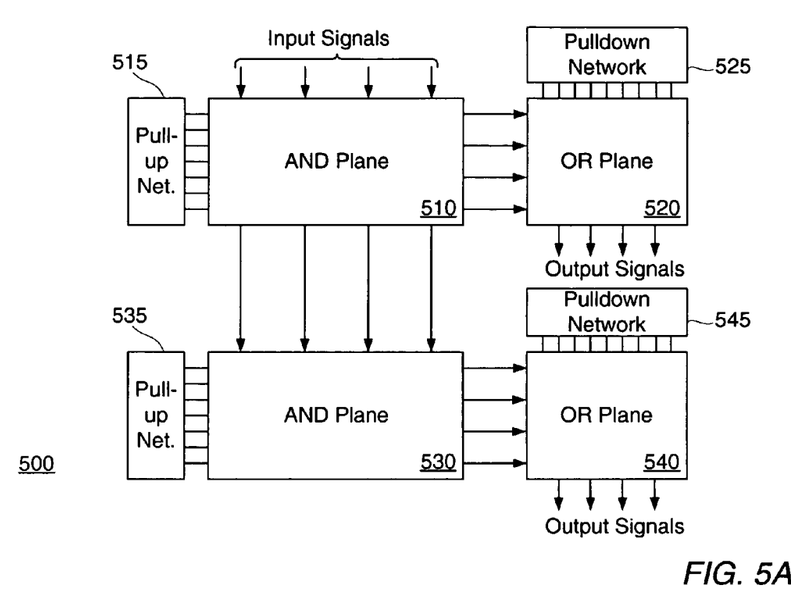
FIGS. 5A–5B illustrate additional examples of implementations of the present invention.

FIGS. 5A–5B illustrate several examples of how molecular electronic devices such as device 200 can be linked together to form larger devices. In FIG. 5A, device 500 includes pullup networks 515 and 535 supporting AND planes 510 and 540 respectively. AND plane 510 is designed to receive input signals and additionally to pass those same input signals through to AND plane 530 for further manipulation. Each of AND plane 510 and 530 provides product terms to a respective OR plane (520 and 540), and each OR plane is supported by a corresponding pulldown network 525 and 545. In the case of device 500, output signals from each of OR plane 520 and 540 are separately provided.

Figure 5B:
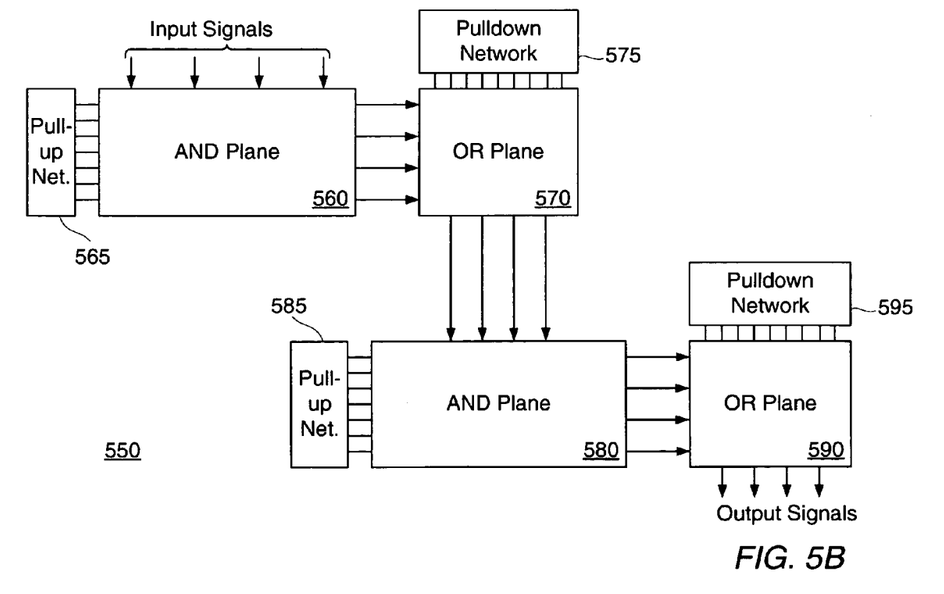

In FIG. 5B, device 550 includes pullup networks 565 and 585 supporting AND planes 560 and 580 respectively. AND plane 560 is designed to receive input signals from outside device 550. Each of AND plane 560 and 580 provides product terms to a respective OR plane (570 and 590), and each OR plane is supported by a corresponding pulldown network 575 and 595. In the case of device 550, output signals from OR plane 570 are provided as input to AND plane 580, and OR plane 590 provided output signals form device 550 as a whole.

These devices are merely illustrative of the manner in which more fundamental devices can be combined. Numerous other combinations and architectures will be known to those having ordinary skill in the art. In some cases, the principles discussed above are still valid for determining the desired number of junctions for a pullup and/or pulldown network. In other cases, it may be desirable to analyze the more complex and interrelated structures to determine proper pullup/pulldown network composition.

While the disclosed devices and techniques have been described in light of the embodiments discussed above, one skilled in the art will also recognize that certain substitutions may be easily made in the circuits without departing from the teachings of this disclosure. For example, a variety of logic gate structures may be substituted for those shown, and still preserve the operation of the circuit, in accordance with DeMorgan's law.

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. Such shorthand phrases for describing circuit operation used herein are more efficient to communicate details of circuit operation, particularly because the schematic diagrams in the figures clearly associate various signal names with the corresponding circuit blocks and node names.

Although the present invention has been described with respect to a specific preferred embodiment thereof, various changes and modifications may be suggested to one skilled in the art and it is intended that the present invention encompass such changes and modifications that fall within the scope of the appended claims.

The invention claimed is:

1. A circuit comprising:
   a programmable cross-wire interconnect, the programmable cross-wire interconnect including:
   a first plurality of wires;
   a second plurality of wires oriented with respect to the first plurality of wires so that a first one of the first plurality of wires crosses a first one of the second plurality of wires at a non-zero angle to form a programmable junction;
   wherein the programmable junction includes a first molecule coupled between the first one of the first plurality of wires and the first one of the second plurality of wires; and
   wherein the first molecule has a first energy state and a second energy state;
   a logic device including an input terminal and an output terminal, wherein at least one of the input terminal and the output terminal is coupled to the first one of the first plurality of wires; and
   at least one of a pullup device and a pulldown device coupled to the logic device, wherein the at least one of a pullup device and a pulldown device includes a second programmable junction formed between the first one of the first plurality of wires and a third wire, wherein the second programmable junction includes a second molecule coupled between the first one of the first plurality of wires and the third, and wherein the second molecule has a first energy state and a second energy state.

2. The circuit of claim 1 wherein at least one of the first one of the first plurality of wires, the first one of the second plurality of wires, and the third wire is a carbon nanotube.

3. The circuit of claim 1 wherein at least one of the first one of the first plurality of wires, the first one of the second plurality of wires, and the third wire is formed from one of a conductor and a semiconductor.

4. The circuit of claim 1 wherein at least one of the first one of the first plurality of wires, the first one of the second plurality of wires, and the third wire is a nanometer-scale wire.

5. The circuit of claim 1 wherein at least one of the first one of the first plurality of wires, the first one of the second plurality of wires, and the third wire has a diameter of approximately 50 nanometers or less.

6. The circuit of claim 1 wherein at least one of the first one of the first plurality of wires, the first one of the second plurality of wires, and the third wire further comprises at least one of:
   a tunneling barrier;
   a modulation-doping coating; and
   an insulating layer.

7. The circuit of claim 1 wherein at least one of the first molecule and the second molecule is one of a rotaxane, a psuedo-rotaxane, and a catenane.

8. The circuit of claim 1 wherein the first molecule and the second molecule are of the same molecular species.

9. The circuit of claim 1 wherein the programmable junction includes a plurality of molecules, and wherein the second programmable junction includes a second plurality molecules.

10. The circuit of claim 1 wherein for at least one of the first molecule and the second molecule the first energy state corresponds to a first junction resistance and the second energy state corresponds to a second resistance.

11. The circuit of claim 1 wherein at least one of the first molecule and the second molecule is part of a monolayer comprising a plurality of molecules.

12. The circuit of claim 1 wherein the logic device is one of an AND gate, a NAND gate, an OR gate, a NOR gate, an XOR gate, and an XNOR gate.

13. The circuit of claim 1 wherein the logic device further comprises a linear array of molecular switch junctions.

14. The circuit of claim 1 wherein the at least one of a pullup device and a pulldown device is a pullup device further comprising:
a third programmable junction formed between the third wire and a fourth wire, wherein the third programmable junction includes a third molecule coupled between the third wire and the fourth wire, and wherein the third molecule has a first energy state and a second energy state.

15. The circuit of claims 14 wherein the second programmable junction and the third programmable junction are programmed to be in substantially the same state.

16. The circuit of claim 1 wherein the at least one of a pullup device and a pulldown device is a pulldown device further comprising:
a third programmable junction formed between the third wire and a fourth wire, wherein the third programmable junction includes a third molecule coupled between the third wire and the fourth wire, and wherein the third molecule has a first energy state and a second energy state;
a fourth programmable junction formed between the fourth wire and a fifth wire, wherein the fourth programmable junction includes a fourth molecule coupled between the fourth wire and the fifth wire, and wherein the fourth molecule has a first energy state and a second energy state; and
a fifth programmable junction formed between the fifth wire and a sixth wire, wherein the fifth programmable junction includes a fifth molecule coupled between the fifth wire and the sixth wire, and wherein the fifth molecule has a first energy state and a second energy state.

17. The circuit of claim 16 wherein the second, third, fourth, and fifth programmable junctions are programmed to be in substantially the same state.

18. The circuit of claim 1 wherein at least one of the first plurality of wires and the second plurality of wires extends to a microelectronic circuit that enables programming.

19. The circuit of claim 1 wherein the at least one of a pullup device and a pulldown device coupled to the logic device includes a plurality of pullup devices coupled to the logic device.

20. The circuit of claim 1 wherein the at least one of a pullup device and a pulldown device coupled to the logic device includes a plurality of programmable junctions arranged in one of series and parallel.

21. A circuit comprising:
a logic device including an input terminal and an output terminal;
a programmable cross-wire interconnect, wherein at least one of the input terminal and the output terminal is coupled to the programmable cross-wire interconnect, the programmable cross-wire interconnect including:
a first plurality of nanometer-scale wires;
a second plurality of nanometer-scale wires oriented with respect to the first plurality of nanometer-scale wires so that ones of the first plurality of nanometer-scale wires cross ones of the second plurality of nanometer-scale wires at non-zero angles to form a plurality programmable junctions;
wherein at least a first one of the plurality of programmable junctions forms one of a pullup device and a pulldown device; and
wherein the at least a first one of the plurality of programmable junctions further comprises a first molecule coupled between a first one of the first plurality of wires and a first one of the second Plurality of wires, wherein the first molecule has a first energy state and a second energy state.

22. The circuit of claim 21 wherein at least a second one of the plurality of programmable junctions is coupled between the logic device and the one of a pullup device and a pulldown device, wherein the at least a second one of the plurality of programmable junctions is programmed to further couple the logic device to another device.

23. The circuit of claim 22 wherein the at least a first one of the plurality of programmable junctions and the at least a second one of the plurality of programmable junctions are programmed to have substantially the same resistance.

24. The circuit of claim 21 wherein at least one of the first plurality of nanometer-scale wires and the second plurality of nanometer-scale wires is a carbon nanotube.

25. The circuit of claim 21 wherein at least one of the first plurality of nanometer-scale wires and the second plurality of nanometer-scale wires is formed from one of a conductor and a semiconductor.

26. The circuit of claim 21 wherein at least one of the first plurality of nanometer-scale wires and the second plurality of nanometer-scale wires has a diameter of approximately 50 nanometers or less.

27. The circuit of claim 21 wherein at least one of the first plurality of nanometer-scale wires and the second plurality of nanometer-scale wires further comprises at least one of:
a tunneling barrier;
a modulation-doping coating; and
an insulating layer.

28. The circuit of claim 21 wherein the first molecule is one of a rotaxane, a psuedo-rotaxane, and a catenane.

29. The circuit of claim 21 wherein the at least a first one of the plurality of programmable junctions includes a plurality of molecules.

30. The circuit of claim 21 wherein the first energy state corresponds to a first junction resistance and the second energy state corresponds to a second resistance.

31. The circuit of claim 21 wherein the first molecule is part of a monolayer comprising a plurality of molecules.

32. The circuit of claim 21 wherein the at least a first one of the plurality of programmable junctions further comprises:
a first programmable state wherein a portion of a first one of the first plurality of wires and a portion of a first one of the second plurality of wires are located a first distance from each other; and
a second programmable state wherein the portion of the first one of the first plurality of wires and the portion of the first one of the second plurality of wires are located a second distance from each other, wherein the second distance is less than the first distance.

33. The circuit of claim 32 wherein the second programmable state further comprises the first one of the first plurality of wires and the first one of the second plurality of wires being in contact with each other.

34. The circuit of claim 32 wherein the first programmable state corresponds to a first junction resistance and the second programmable state corresponds to a second resistance.

35. The circuit of claim 21 wherein the at least a first one of the plurality of programmable junctions further comprises two programmable junctions coupled in series to form a pullup device, and wherein the pullup device is coupled between the input terminal of the logic device and a power source.

36. The circuit of claim 21 wherein the at least a first one of the plurality of programmable junctions comprises four programmable junctions coupled in series to form a pulldown device, and wherein the pulldown device is coupled between the input terminal of the logic device and ground.

37. The circuit of claim 21 wherein the logic device is one of an AND gate, a NAND gate, an OR gate, a NOR gate, an XOR gate, and an XNOR gate.

38. The circuit of claim 21 wherein at least one of the first plurality of nanometer-scale wires and the second plurality of nanometer-scale wires extends to a microelectronic circuit that enables programming.

39. The circuit of claim 21 wherein the at least a first one of the plurality of programmable junctions that forms one of a pullup device and a pulldown device further comprises a plurality of programmable junctions arranged in one of series and parallel.

40. A method comprising:
applying a first signal to at least one of a first nanometer-scale wire and a second nanometer-scale wire to establish an electrical connection between the first nanometer-scale wire and the second nanometer-scale wire, wherein the electrical connection between the first nanometer-scale wire and the second nanometer-scale wire has a first resistance;
applying a second signal to at least one of the second nanometer-scale wire and a third nanometer-scale wire to establish an electrical connection between the second nanometer-scale wire and the third nanometer-scale wire, wherein the electrical connection between the second nanometer-scale wire and the third nanometer-scale wire has a second resistance;
coupling one of an input signal and an output signal through the electrical connection between the first-nanometer scale wire and the second-nanometer scale wire to a logic device; and
coupling one of a pullup voltage and a pulldown voltage to the logic device through the electrical connection between the first-nanometer scale wire and the second-nanometer scale wire, and through the electrical connection between the second nanometer-scale wire and the third nanometer-scale wire.

41. The method of claim 40 further comprising:
applying a third signal to at least one of the third nanometer-scale wire and a fourth nanometer-scale wire to establish an electrical connection between the third nanometer-scale wire and the fourth nanometer-scale wire, wherein the electrical connection between the third nanometer-scale wire and the fourth nanometer-scale wire has a third resistance, and wherein the coupling one of a pullup voltage and a pulldown voltage further comprises:
coupling one of a pullup voltage and a pulldown voltage to the logic device through the electrical connection between the first-nanometer scale wire and the second-nanometer scale wire, through the electrical connection between the third nanometer-scale wire and the fourth nanometer-scale wire, and through the electrical connection between the second nanometer-scale wire and the third nanometer-scale wire.

42. The method of claim 40 wherein the first resistance and the second resistance are substantially the same.

43. The method of claim 40 wherein the first signal and the second signal are substantially the same.

44. The method of claim 40 wherein the applying a first signal to at least one of a first-nanometer scale wire and a second-nanometer scale wire further comprises at least one of:
applying a voltage across at least one of the first nanometer-scale wire and the second nanometer-scale wire;
applying a voltage between the first nanometer-scale wire and the second nanometer-scale wire; and
charging at least one of the first nanometer-scale wire and the second nanometer-scale wire to produce one of an attractive force and a repulsive force.

45. The method of claim 40 wherein the applying a second signal to at least one of the second nanometer-scale wire and a third nanometer-scale wire further comprises at least one of:
applying a voltage across at least one of the second nanometer-scale wire and the third nanometer-scale wire;
applying a voltage between the second nanometer-scale wire and the third nanometer-scale wire; and
charging at least one of the second nanometer-scale wire and the third nanometer-scale wire to produce one of an attractive force and a repulsive force.

46. The method of claim 40 wherein the coupling one of a pullup voltage and a pulldown voltage to the logic device further comprises
coupling a pullup voltage to the logic device through the electrical connection between the first-nanometer scale wire and the second-nanometer scale wire, and through the electrical connection between the second nanometer-scale wire and the third nanometer-scale wire, wherein the pullup voltage corresponds to a power supply voltage.

47. The method of claim 40 wherein the coupling one of a pullup voltage and a pulldown voltage to the logic device further comprises
coupling a pulldown voltage to the logic device through the electrical connection between the first-nanometer scale wire and the second-nanometer scale wire, and through the electrical connection between the second nanometer-scale wire and the third nanometer-scale wire, wherein the pulldown voltage corresponds to ground.

48. The method of claim 40 wherein at least one of first nanometer-scale wire, the second nanometer-scale wire, and the third nanometer-scale wire is a carbon nanotube.

49. The method of claim 40 wherein at least one of first nanometer-scale wire, the second nanometer-scale wire, and the third nanometer-scale wire is formed from one of a conductor and a semiconductor.

50. The method of claim 40 wherein at least one of first nanometer-scale wire, the second nanometer-scale wire, and the third nanometer-scale wire has a diameter of approximately 50 nanometers or less.

51. The method of claim 40 wherein at least one of first nanometer-scale wire, the second nanometer-scale wire, and the third nanometer-scale wire further comprises at least one of:
- a tunneling barrier;
- a modulation-doping coating; and
- an insulating layer.

52. The method of claim 40 wherein the applying a first signal further comprises at least one of:
- changing an energy state of a molecule coupled between the first nanometer-scale wire and the second nanometer-scale wire;
- causing a portion of the first nanometer-scale wire to contact a portion of the second nanometer-scale wire; and
- changing a separation between the portion of the first nanometer-scale wire and the portion of the second nanometer-scale wire.

53. The method of claim 40 wherein the applying a second signal further comprises at least one of:
- changing an energy state of a molecule coupled between the second nanometer-scale wire and the third nanometer-scale wire;
- causing a portion of the second nanometer-scale wire to contact a portion of the third nanometer-scale wire; and
- changing a separation between the portion of the second nanometer-scale wire and the portion of the third nanometer-scale wire.

* * * * *